(12) United States Patent
Jiang

(10) Patent No.: US 6,207,234 B1
(45) Date of Patent: Mar. 27, 2001

(54) VIA FORMATION FOR MULTILAYER INDUCTIVE DEVICES AND OTHER DEVICES

(75) Inventor: John J. Jiang, Vinton, VA (US)

(73) Assignee: Vishay Vitramon Incorporated, Monroe, CT (US)

( * ) Notice: Subject to any disclaimer, the term of this patent is extended or adjusted under 35 U.S.C. 154(b) by 0 days.

(21) Appl. No.: 09/103,962

(22) Filed: Jun. 24, 1998

(51) Int. Cl.[7] .................................. B05D 5/12; B05D 3/04
(52) U.S. Cl. ............................. 427/333; 427/97; 427/79; 216/17; 216/18; 216/39; 156/628.1
(58) Field of Search .................................. 427/96, 97, 79, 427/80, 333, 407.1, 419.2; 156/628.1; 216/17, 18, 39, 83

(56) References Cited

U.S. PATENT DOCUMENTS 5,560,199   10/1996   Agustin et al. .................. 60/274
5,650,199 *  7/1997   Chang et al. ..................... 427/33

* cited by examiner

Primary Examiner—Brian K. Talbot
(74) Attorney, Agent, or Firm—Zarley, McKee, Thomte, Voorhees & Sease

(57) ABSTRACT

A method of creating a multilayer ceramic component of the present invention is used to spontaneously create vias between adjacent conductor layers in a multilayer inductive component. After a first conductive layer is printed, a via dot is printed on the first conductive layer. Next, a controlled thickness of ceramic slurry is cast over the previous ceramic layer, first conductive pattern, and the via dot. The physical/chemical forces between the via dot and the ceramic slurry expel the slurry in the proximity of the top surface of the via dot. When the ceramic slurry dries, the ceramic cast leaves vias filled with conductors from the preprinted via dots. This process is repeated until a desired number of conductive layers are formed.

12 Claims, 6 Drawing Sheets

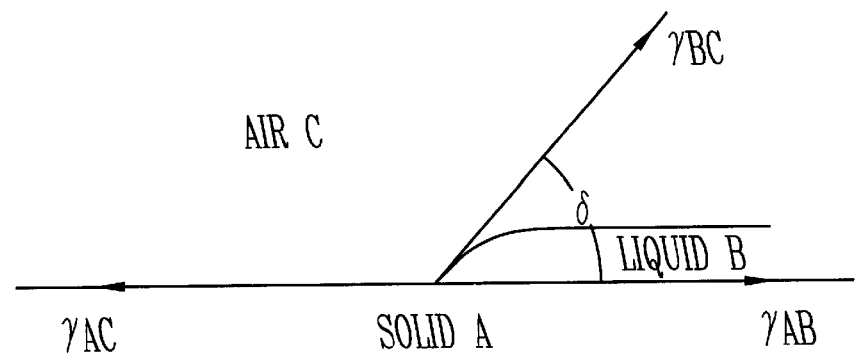
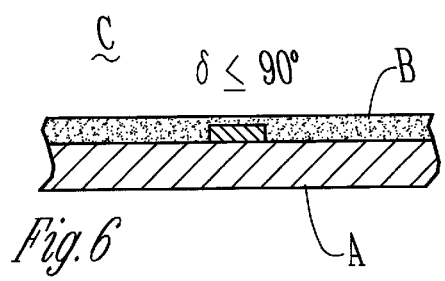
Fig. 5
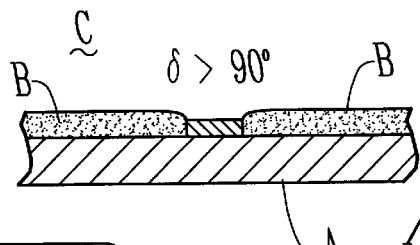
Fig. 6
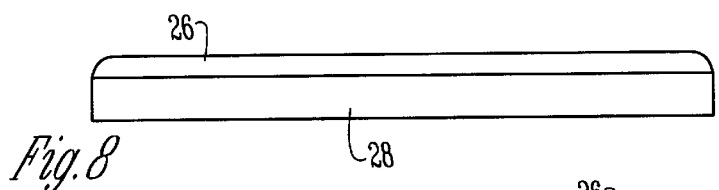
Fig. 7
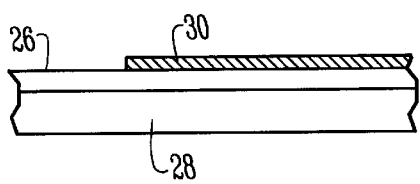
Fig. 8
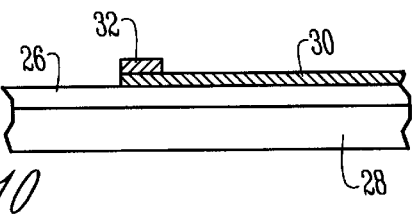
Fig. 9
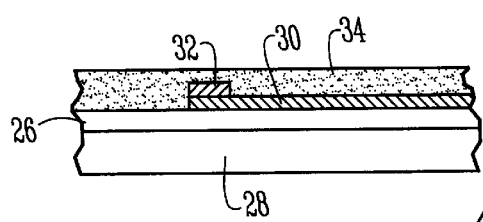
Fig. 10
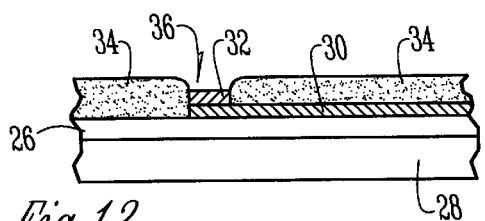
Fig. 11
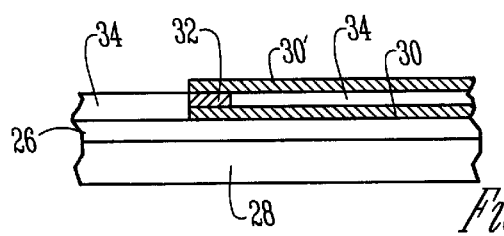
Fig. 12
Fig. 13

VIA FORMATION FOR MULTILAYER INDUCTIVE DEVICES AND OTHER DEVICES

BACKGROUND OF THE INVENTION

1. Field of the Invention

The present invention relates to multilayer devices. More particularly, though not exclusively, the present invention relates to a method and apparatus for forming vias in multilayer devices.

2. Problems in the Art

Traditionally, inductive components are made with wire wound around a core, either magnetic for high inductance or non-magnetic for low inductance. Winding is typically done by hand or by a specially designed machine. However, this process limits the potential of miniaturization to meet the increasing demand for high density surface mount components. New types of inductive components, namely surface mount types, are needed to meet the demand in the industry.

Different types of low inductance planar inductors have been made into single layer surface mount chips. However, higher inductance values cannot be achieved with this configuration. The inductance of an inductor is proportional to the effective cross sectional area as well as the number of turns in the inductor. Increasing the number of turns on the same planar layer reduces the effective magnetic cross sectional area. A third dimension in thickness can be utilized for the advantage of adding turns to the inductor while maintaining the cross sectional area.

To utilize the multilayer process for inductors, interconnections between layers to form a continuance coil are necessary for high inductance values. Conventional interconnection between layers in a multilayer device is typically achieved through vias formed either by a mechanical punch, chemical etch, or laser. Once the vias are formed, they are filled with a conductor. Devices utilizing this process may include printed circuit boards, integrated circuit packages, multilayer ceramic inductors, RF filters or beads, etc.

Due partly to the complexity and durability of a mechanical punch, a punch is very expensive to fabricate and maintain. The fastest laser via formation is currently approximately 200 per second, which is still too slow for some multilayer devices. Chemical etches are even slower. In the competitive chip bead/inductor market, these techniques are not suitable for high speed mass production. Therefore, there is a desire for a technique of via formation which is fast, reliable, and economical.

Similar to the inductors described above, capacitors have also been manufactured in the form of surface mountable chips using multilayer ceramic processes. In the manufacturer of multilayer ceramic capacitors, absolute insulation between the layers of dielectric is required. Occasionally, some lumps are formed in the printed electrode due to conglomerated particles in electrode ink or debris from undesired sources. When the ceramic slurry is cast over the lumpy electrode in the wet stack process, it tends to make shorts in the capacitor. Similar shorts also occur in dry sheet or tape process capacitors (described below). This is undesired and uncontrolled, and therefore is a random phenomena. Manufacturers of such devices strive to keep lumps much smaller than the dielectric thickness in order to make quality components.

The fabrication of typical prior art components will now be described. Multilayer ceramic inductors or chip beads are fabricated with alternate layers of ceramic and conductor loops interconnected through layers. This fabrication can be categorized primarily into two types of techniques. The first technique is a tape (also called dry-sheet) process. A second technique is a wet stack process.

The tape process involves tape casting, tape drying, cutting, stacking, conductor printing, conductor drying, . . . stacking, conductor printing, conductor drying, stacking, laminate-pressing, dicing, organic burn-out, and firing. Another variation of the taped process includes tape casting, tape drying, conductor printing, conductor drying, tape storing, stack laminating/pressing, carrier releasing, dicing, organic burnout, and firing. In the manufacture of components with interconnections, a via punch process is required either after the tape drying or cutting and a via filling before or simultaneously with the conductor printing. A precise and consistent registration is essential for this operation. As mentioned previously, the via formation can be accomplished by a mechanical punch, a laser, or by a chemical etch. As mentioned, the cost of tooling fabrication and maintenance for a mechanical punch is very expensive. A punch has a relatively short life span. Chemical etches take long period of time and are difficult to control. A thorough rinse is necessary which again takes time. The via formation by lasers is still slow and difficult to maintain a throughput of thousands of vias per second for mass production. However, the advantages of the taped process are flexibility, fast taped casting, fast drying with good quality, precise and accurate tape thickness.

In the wet stack process, ceramic layers are cast or printed onto a substrate and dried. The conductors are then printed and dried, and cast and printed again. For interconnections, a via or an exposed area is needed to bridge the conductors across the insulation layer. This is not easily accomplished by ceramic casting. Normally, a blocking of the ceramic print is employed to leave an exposed area, or via. The advantage of this process is the ease of conductor registration. This is accomplished through the registration of the substrate, normally a metal plate. However, the ceramic ink suitable for repeatable screen printing and production is required to be a slow dry ink and have low viscosity for good leveling. If not, the screen can get clogged up which deteriorates the print quality or demands periodic screen cleaning which takes time. In addition, due to the slow dry time and low viscosity of the ink, the wet ceramic print will tend to flow. The print registration as well as quality is affected. A worse case scenario may be that the via is completely blocked with the flow. To overcome the tendency to flow while maintaining a slow dry, the ceramic ink is formulated in a higher viscosity form or a more psuedoplastic form with high molecular weight organic binders and additives. These organics make the drying and burnout even more difficult. The slow dry characteristic coupled with the high molecular weight organics of printable ink requires a prolonged drying at high temperatures. This drying cycle may cause hardened skin on the ceramic layer and subsequently result in cracks or delamination.

Various prior art techniques have been used to form vias in multilayer components. Following are some examples.

U.S. Pat. No. 4,689,594 issued to Kawabata et al. discloses a process of fabricating multilayer chip coils by stacking magnetic tape with conductor path interconnected via holes coated with electroconductive material. U.S. Pat. No. 5,300,911 issued to Walters discloses monolithic magnetic devices made from ceramic sheets with through holes plated with copper conductors. U.S. Pat. No. 4,322,689 to Takahashi et al. discloses block-printing a magnetic layer to cover the lower half of a conductive coil, leaving an exposed segment of the coil to be connected to the next coil. The upper half of the conductive coil is partially covered by printing another magnetic layer. Repeating this alternating print pattern fabricates a laminated inductor component. U.S. Pat. No. 4,731,297 issued to Takaya discloses a similar method of altering the halves of superimposed ferrite and coil prints to manufacture laminated components. U.S. Pat. No. 5,302,932 issued to Person et al. discloses a process for making monolithic multilayer chip inductors having printed magnetic layers with vias and subsequently filling the vias by screen printing.

Prior art fabrication techniques for multilayer components, including ceramic inductors/beads, can be slow, difficult and/or expensive. Prior techniques do not satisfy the demand of the surface mount industry. Manufacturers using these prior art techniques cannot produce a high volume of components to match other surface mount devices. Even though the surface mount multilayer ceramic inductors/beads have been introduced into the market, they are still very expensive and have long lead times. It can therefore be seen that a new technology is desired to produce the components in large quantities in a fast and economical manner.

FEATURES OF THE INVENTION

A general feature of the present invention is the provision of a method and apparatus for producing multilayer devices which overcomes problems found in the prior art.

A further feature of the present invention is a provision of a method and apparatus that produces multilayer devices which utilizes the physical/chemical forces to form vias spontaneously in the multilayer build up process.

Further features, objects, and advantages of the present invention include:

A method and apparatus for producing multilayer devices such as surface mount ceramic inductive components.

A method and apparatus for producing multilayer devices in mass quantity with a consistent superior quality.

A method and apparatus for producing multilayer devices at a low cost.

A method and apparatus for producing multilayer devices which does not require extra equipment other than that currently used for the multilayer ceramic build up.

A method and apparatus for producing multilayer devices having a fast via formation process during production.

A method and apparatus for producing multilayer devices using physical/chemical forces resulting from the interaction between the via conductor and the cast ceramic slurry.

A method and apparatus for producing multilayer devices including the formation of vias at rates of thousands to ten of thousands per second.

These as well as other features, objects and advantages of the present invention will become apparent from the following specification and claims.

SUMMARY OF THE INVENTION

The method of the present invention is used to create interconnections between two adjacent conductor layers in a multilayer ceramic component. The method includes the steps of providing a ceramic base having a first conductor formed on the base, printing a via dot on the first conductor, and casting a quantity of ceramic slurry over the ceramic base, first conductor, and via dot such that the forces between the via dot and the ceramic slurry expel the ceramic slurry in the proximity of the via dot, leaving the upper surface of the via dot exposed. Next, a second conductor is formed over the dried ceramic layer and the via dot such that the via dot provides an interconnection between the first and second conductors.

BRIEF DESCRIPTION OF THE DRAWINGS

FIG. 5 is a diagram defining the wetting angle.

FIGS. 6 and 7 depict different wetting angles in the via process.

FIG. 8 is an illustration of a ceramic base layer casting on a carrier.

FIG. 9 is an illustration of a conductive path printed on the ceramic base.

FIG. 10 is an illustration of a via dot printed on the conductive pattern.

FIG. 11 is an illustration of a cast of the ceramic layer initially covering the printed conductor path and via dot.

FIG. 12 is an illustration of the interaction between the chemical/physical forces and the ceramic slurry that expels the slurry on top of the via dot surface.

FIG. 13 is an illustration of a second conductive pattern printed on the ceramic layer and via dot.

DETAILED DESCRIPTION OF THE PREFERRED EMBODIMENT

The present invention will be described as it applies to its preferred embodiment. It is not intended that the present invention be limited to the described embodiment. It is intended that the invention cover all alternatives, modifications, and equivalencies which may be included within the spirit and scope of the invention.

The present invention takes advantage of the different nature of inductors and capacitors. The invention utilizes the undesired short phenomena that occurs in fabrication of multilayer ceramic capacitors (described above) as the interconnect in inductors.

Figure 1:
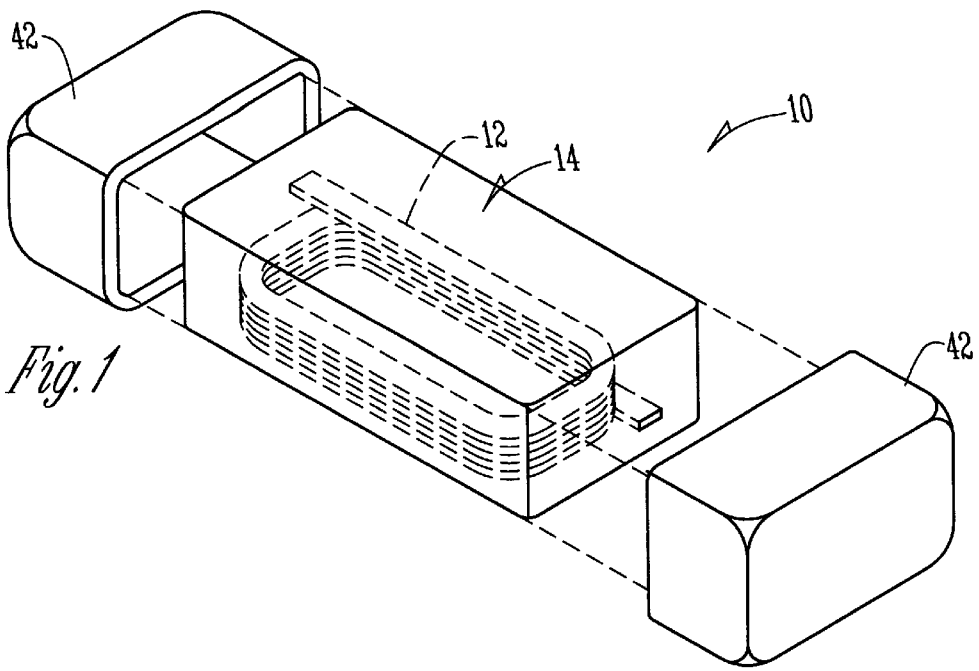
FIG. 1 is an exploded view of a multilayer ceramic inductor.
Figure 4:
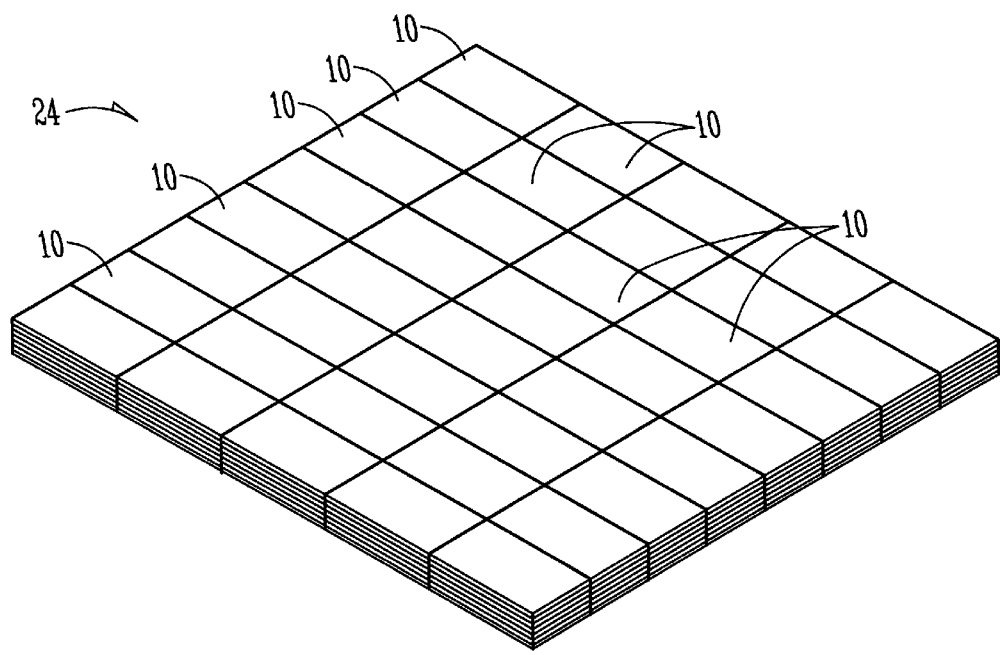
FIG. 4 is an illustration of a multilayer ceramic build up wafer consisting of many individual components.
Figure 2:
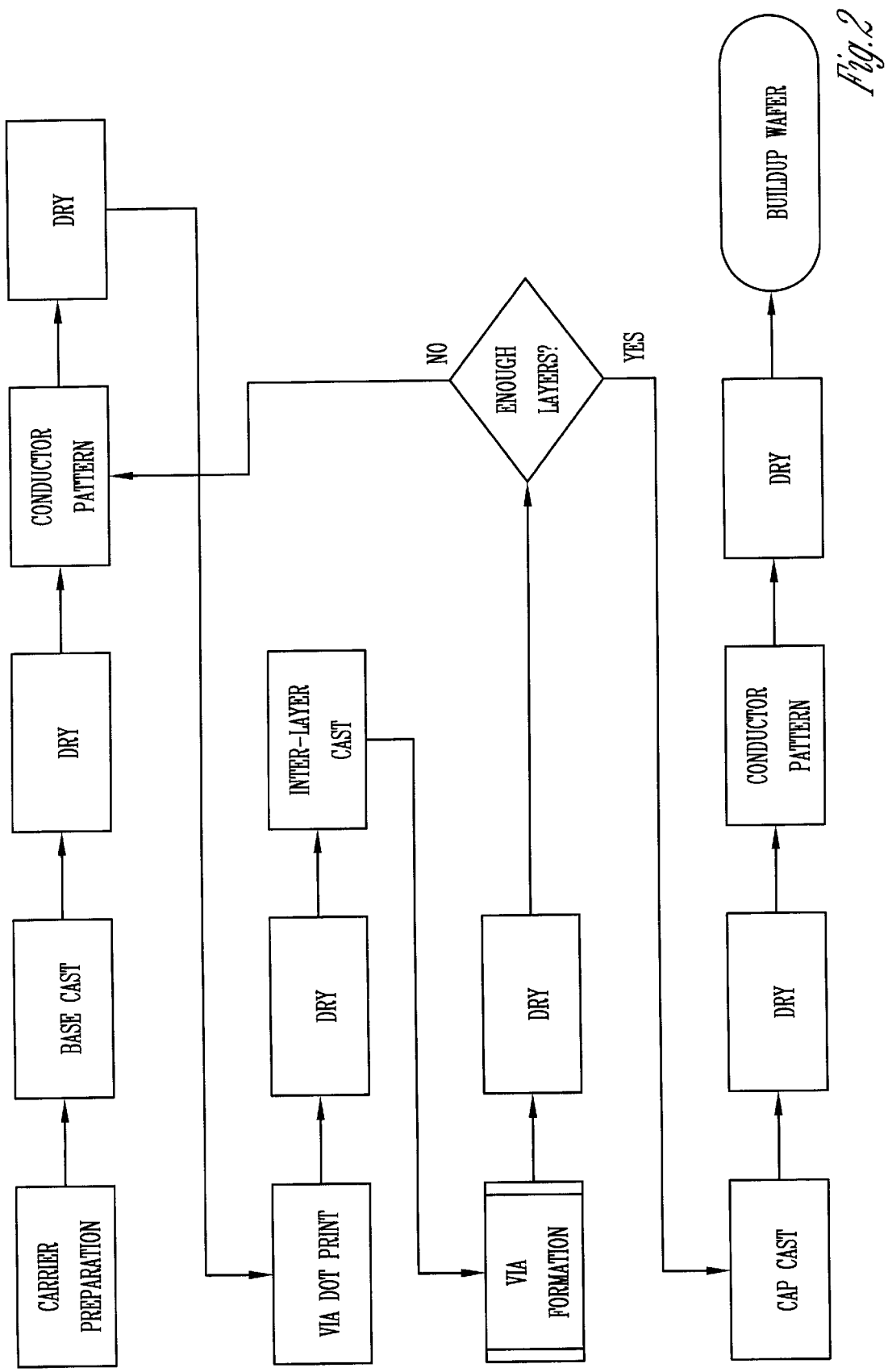
FIG. 2 is a flow chart of the manufacturing process of the present invention.
Figure 3:
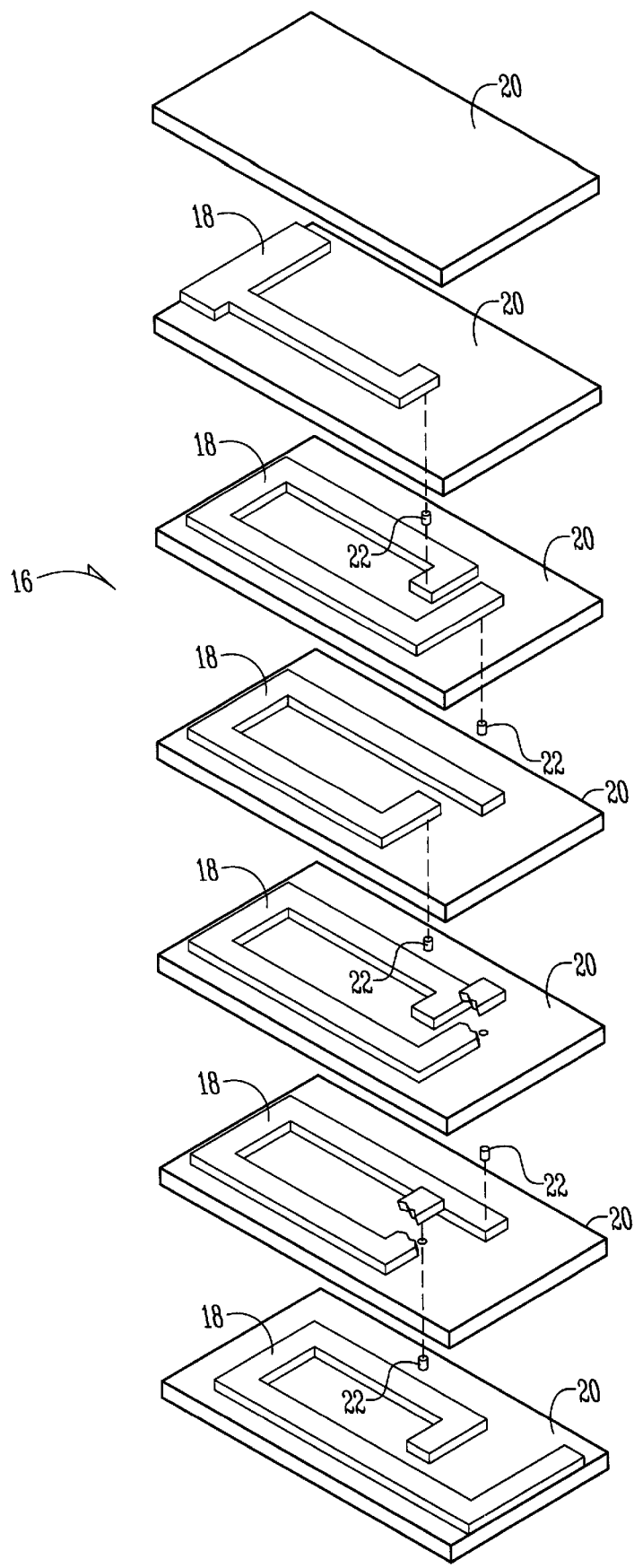
FIG. 3 is an exploded diagram showing a typical multilayer ceramic inductor illustrating the various conductive layers and vias.

FIG. 1 shows a multilayer ceramic inductive device 10. The device 10 is comprised of a coil 12 embedded within a multilayer ceramic structure 14. The ceramic structure 14 can be either magnetic for higher inductance values or non-magnetic for higher frequency applications. The present invention is used with a multilayer ceramic inductor build up process. One example of the build up process includes the steps of: formation of ferrite slurry, conductor ink, multilayer build up, dicing, organic burnout, sintering, tumbling, terminating, termination firing, testing, and packaging. FIG. 2 is a block diagram illustrating the detailed procedures of the preferred build up process used with the present invention. FIG. 2 can be referred to as the invention is described in detail below. The remaining processes may be identical or similar to those used in manufacturing typical multilayer ceramic components. FIG. 3 is an exploded diagram of a typical multilayer ceramic inductor 16. As shown, the inductor includes various coil layers 18 formed on substrates 20. As shown, each coil layer 18 is electrically connected to the adjacent coil layers 18 by vias 22. The vias 22 shown in FIG. 3 are intended to be generic, in order to simply illustrate their purpose in connecting adjacent coil layers 18. Typically, a finished ceramic build up wafer consists of a large number of individual chip inductors 10 as shown in FIG. 4. The wafer 24 is later cut or diced into the individual chips 10. The chips are then processed in the manner described above resulting in a finished component.

The present invention relies on the physics of surfaces and surface tension. Therefore, following is a background of the physics and chemistry associated with the present invention. Surface tension is defined as:

$$\gamma AB = \gamma AC + \gamma BC \cdot \cos(\delta)$$

where γAB is the surface tension between a solid A and a liquid B, γAC is the surface tension between a solid A and air C, γBC is the surface tension between a liquid B and air C, and sigma is the contact angle, as defined in FIG. 5. FIGS. 6 and 7 depict the wetting angles in the via formation process described in detail below. Ideally, for via formation, non-wetting is preferred where cos (σ)<0, i.e. σ>90°, or γAB<<γAC, or at least poor wetting is required for the formation: σ~90°, i.e. cos (σ)~0; γAB≈γAC and/or γBC is very high. When σ<90°, it is defined as wetting which will not form vias.

To reduce the invention (described in detail below) to practice, the following types of inks or combinations thereof are preferably used: a hydrophobic via ink with an aqueous slurry; an organaphobic via ink with a solvent base slurry; a waxy via dot ink; a hot melt via ink; a via ink containing a high molecular weight solvent which has a very low chemical affinity to the slurry system; a via ink containing a surfactant with a high surface tension with the slurry system; a slurry system chemically imcompatible to the via ink; a very high surface tension fluid in the slurry system; a via dot ink and the slurry system to fulfill the requirements of: γAB<γAC, or γAB~γAC, and/or γBC very high. In order to improve the quality, smooth surface of via dots is desired.

Another important factor that enhances the via formation of the present invention is low surface friction, or low surface friction coefficient. The formula for the surface friction coefficient is: $Cf=2F/pSV^2$. Where p is the fluid density, V is velocity of the undisturbed stream, F is the over all surface friction force, and S is the wetted area of the body surface. $C_f$ decreases with the Reynolds number in both Laminer and turbulent flow. Surface roughness is important, both as a factor in precipitating transition in Laminer flow and also because it increases a surface friction in turbulent flow.

As seen in the equation above, the higher the velocity V, lower the surface friction coefficient $C_f$. Due to the viscosity and the momentum of the slurry during and after the casting, it flows at a speed V proportional to the relative speed of the casting head. Therefore, the faster the casting speed is, the easier it is for the slurry to move away in the formation of a via (described below).

FIG. 8 shows the beginning of the build up process. As shown in FIG. 8, a ceramic slurry 26 is cast onto a carrier 28 to form a base. The carrier 28 can be comprised of a film, a stainless steel sheet, a metal plate, or a substrate, etc. The carrier 28 provides a support to the ceramic layers during the build up process. The ceramic base is normally employed to protect the component as well as the circuitry electrically and/or magnetically. On some occasions, the base is not needed. The base may be a single or multiple cast of ceramic, depending upon the thickness of the base and the thickness of a cast layer. A drying step follows each cast (see FIG. 2).

As shown in FIG. 9, a conductor pattern 30 is printed onto the ceramic base at the predefined position and pattern. For a surface mount chip component such as a multilayer ceramic inductive component, manufacturers typically make thousands of chips in one build up pallet in order to increase production efficiency. Therefore a pattern of thousands of conductor coils are printed onto the ceramic base (see FIG. 4). The conductor print 30 is then dried and followed by a print of the via dots 32 on the conductor coils 30 as shown in FIG. 10. After the via dots 32 are printed, the via dots 32 are allowed to dry. Note that the registration of the via dots 32 on the coils 30 is very critical in the process of the present invention. As the coils 30 are connected serially through the layers as shown in FIGS. 1 and 3, one single disconnect disrupts the serial connection and makes the inductor inoperative. The via dots 32 are printed with a special formulation of conductor ink (described above) which introduces physical and/or chemical forces (also described above) to interact with the ceramic slurry which is cast in the next process step (see FIG. 2). FIG. 11 shows the ceramic slurry 34 cast over the coils 30 and via dots 32. After the cast, the layer of ceramic slurry 34 covers the previous ceramic layer 26, the conductor pattern 30, and the via dots 32. At this point, the ceramic slurry 34 is not dried immediately and is kept at room temperature for approximately 2–30 seconds before entering into a dryer. This time period is used to maintain the slurry 34 in a fluid state and to allow the interaction forces to expel the slurry off the top of the surface area of the via dots 32. As shown in FIG. 12, a via 36 will be formed on top of the via dot 32. Upon drying, the ceramic layer 34 shrinks to the thickness equivalent to the via dots 32. The process described above provides a spontaneous formation of vias.

Figure 14:
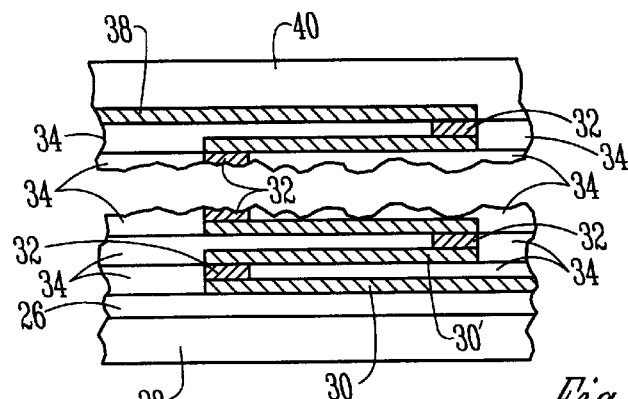
FIG. 14 is an illustration showing the top conductive pattern and cast top ceramic layers.

As illustrated in the block diagram of FIG. 2, if more layers are desired, the process can continue. In this case, an additional conductor pattern is printed and a conductor coil 30' will make a connection with the via conductor 32 as shown in FIG. 13. After the print is dried, additional via dots 32 are printed and dried and followed by the ceramic cast, via formation, and dry described above. Repeating the conductor print, via dot print, ceramic cast cycle, can be performed until a desired number of layers is achieved. Finally, a top conductor pattern 38 is printed and dried. The conductor pattern 38 provides a path to connect the internal coil to the external terminal in the same way that the bottom conductor does. Finally, a top ceramic layer 40, or cap, is cast and dried to complete the build up cycle as shown in FIG. 14.

Figure 15:
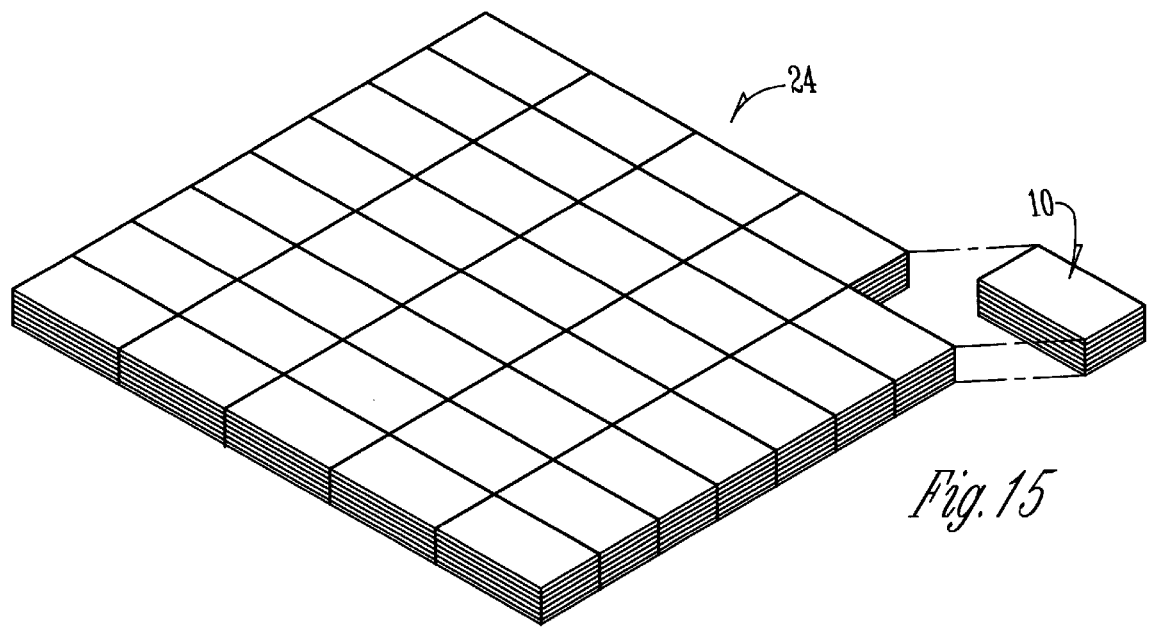
FIG. 15 is an illustration of the dicing process.
Figure 16:
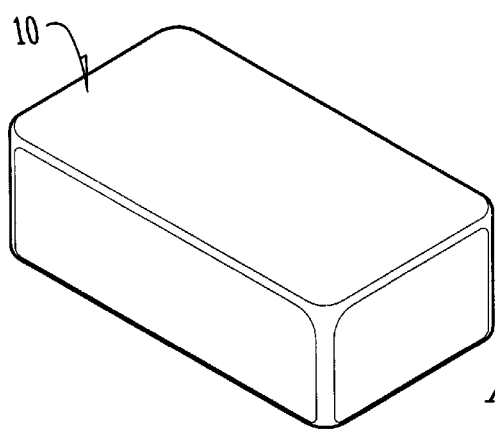
FIG. 16 is an illustration of a tumbled (rounded corners) chip.
Figure 17:
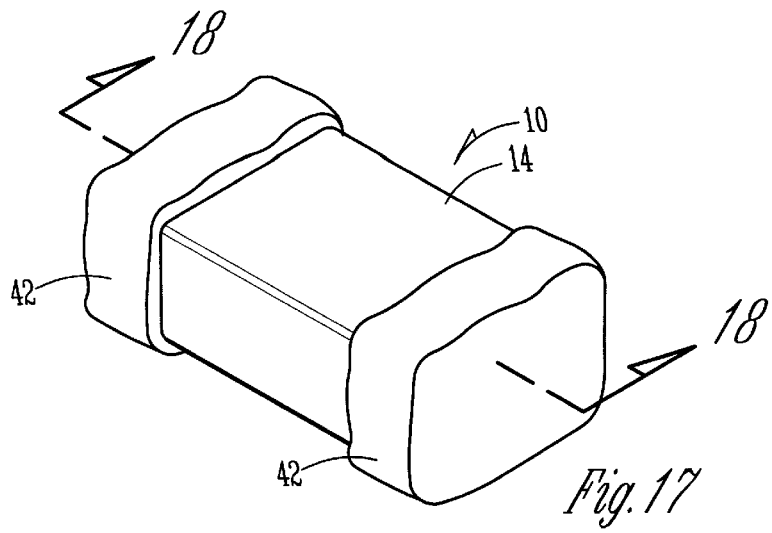
FIG. 17 is an illustration of the chip shown in FIG. 16 with terminations formed.
Figure 18:
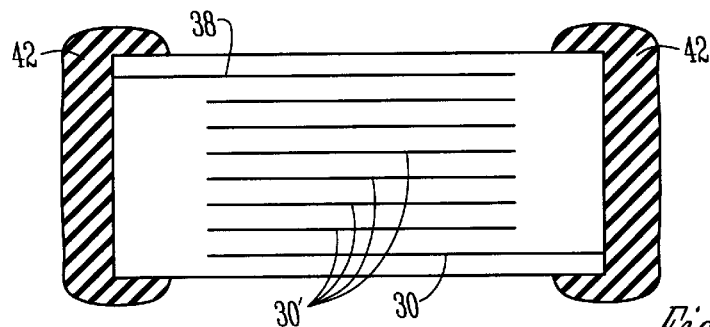
FIG. 18 is a sectional view taken along lines 18—18 of FIG. 17.

A predefined waiting/drying period is allowed to insure cutting quality and efficiency. The multilayer ceramic wafer 24 is then cut or diced into individual components 10 as shown in FIG. 15. Note that the wafer 24 shown in FIGS. 4 and 15 shows only 40 components 10, although many more components may be included on a single wafer. All of the separated individual components 10 are then placed into ceramic substrates and loaded into a sintering furnace. The sintering process fuses the individual layers of ceramic into a dense body that sandwiches the conductor coil inside. After the sintering process, the components 10 are tumbled to round the corners as shown in FIG. 16. Next, a silver paste is applied to the ends of the ceramic chip 10 by dipping, brushing, or any equivalent method. After firing, the silver fuses to the conductive terminals, wrapping around the ceramic body as illustrated in FIG. 17. The barrier layers are plated onto the silver terminals for the surface mount applications. FIG. 17 illustrates the resulting terminals 42 that are formed. The finished component 10 is illustrated in a sectional view in FIG. 18. Note that FIG. 17 is a simplified view simply illustrating the relative placement of the coil layers 30, 30' and top layer 38. Note that the vias are not shown in FIG. 18 for purposes of clarity.

Figure 19:
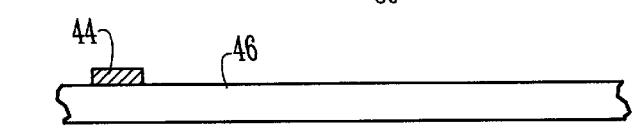
FIGS. 19–22 illustrate the via formation process on a release carrier film or tape.
Figure 20:
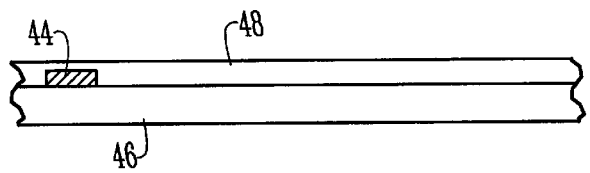
Figure 21:
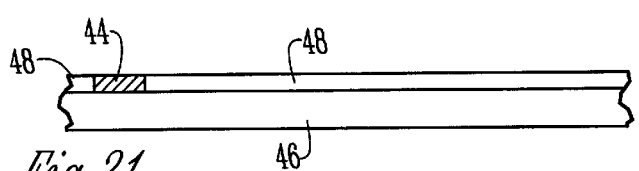
Figure 22:
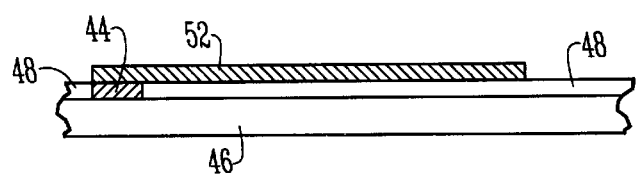

FIGS. 19–22 illustrate an alternative process which can be used with the present invention, namely a dry sheet or tape process. As shown in FIG. 19, first, via dots 44 are printed onto a carrier film 46. After drying, ceramic slurry 48 is cast onto the film 46 and the dots 44 (FIG. 20). The physical and/or chemical forces expel the slurry on top of the via dot 44 surface as described above. The vias are then formed in the same manner as described previously. After the ceramic slurry 48 has dried, the conductor filled vias will be embedded into the ceramic layer 48 (FIG. 21). A conductor pattern 52 is then printed on the ceramic layer 48 making contact with the via conductor 44. Upon drying, the ceramic/conductor assembly can be stored for later use to build devices with interconnections. In the fabrication of multilayer devices with interconnections, the ceramic sheet/tape with filled vias and printed conductor pattern is registered, stacked, pressure laminated, and cut. The individuals go through the organic burnout, firing, tumbling, terminating, testing, and packaging processes mentioned above.

The spontaneous via formation described above can also be used to make other devices, including but not limited to, multilayer printed circuit boards, integrated circuit packages, LC, LR, LCR integrated devices, transformers, electronic filters, and any other multilayered devices having circuitry with interconnections. The separation layers may be ceramic or may be any other type.

The preferred embodiment of the present invention has been set forth in the drawings and specification, and although specific terms are employed, these are used in a generic or descriptive sense only and are not used for purposes of limitation. Changes in the form and proportion of parts as well as in the substitution of equivalents are contemplated as circumstances may suggest or render expedient without departing from the spirit and scope of the invention as further defined in the following claims.

What is claimed is:

1. A method of creating a multilayer ceramic component having multiple conductive layers and interconnections between adjacent conductive layers, the method comprising the steps of:
   providing a ceramic base;
   providing a first conductive pattern on the base;
   printing a conductive via dot over the first conductive pattern, the conductive via dot having a size and location corresponding to the size and location of a desired interconnection;
   casting a quantity of ceramic slurry over the ceramic base, the first conductive pattern, and the conductive via dot;
   controlling the thickness of the ceramic layer such that a high surface tension between the ceramic slurry and the conductive via dot expels the ceramic slurry in the area of a top surface of the conductive via dot;
   allowing the ceramic layer to dry; and
   printing a second conductive pattern over the dried ceramic layer and over the conductive via dot, wherein the conductive via dot forms an interconnection between the first conductive pattern and the second conductive pattern.

2. The method of claim 1 further comprising the step of providing a ceramic cap over the dried ceramic layer and the second conductive layer.

3. The method of claim 2 further comprising the step of forming conductive terminations at opposite ends of the ceramic component.

4. The method of claim 1 wherein the steps of printing a first conductive pattern, printing a conductive via dot, and casing a quantity of ceramic slurry are repeated in order to increase the number of layers in the multilayer component.

5. The method of claim 1 wherein a plurality of multilayer ceramic components are created simultaneously in a wafer form and later separated into individual components.

6. A method of creating interconnections between two adjacent conductor layers in a multilayer ceramic component comprising the steps of:
   providing a ceramic base having a first conductor printed on the base;
   printing a conductive via dot on the first conductor where an interconnection is desired;
   casting a ceramic layer over the base, first conductor, and via dot, the ceramic layer having a controlled thickness and a chemical composition such that the physical forces between the via dot and the ceramic layer expels the ceramic layer in the area above the via dot, leaving an upper surface of the via dot exposed; and allowing the ceramic layer to dry; and printing a second conductor over the dried ceramic layer and over the conductive via dot.

7. The method of claim 6 further comprising the step of casting a ceramic cap over the second conductor in order to form a ceramic cap.

8. The method of claim 7 further comprising the step of forming conductive terminations at opposite ends of the multilayer ceramic component.

9. The method of claim 7 further comprising the steps of:

printing a second conductive via dot on the second conductor where a second interconnection is desired;

casting a second ceramic layer over the first ceramic layer, the second conductor, and second conductive via dot;

allowing the second ceramic layer to dry; and printing a third conductor over the dried second ceramic layer and over the second conductive via dot.

10. The method of claim 6 wherein the multilayer ceramic component is comprised of an inductor, wherein the first conductor and second conductor each comprise portions of a conductive coil.

11. A method of creating a multilayer component having multiple conductive layers and interconnections between adjacent conductive layers using a dry sheet or tape process, the method comprising the steps of:

providing a carrier film;

printing one or more conductive via dots on the carrier film;

casting a quantity of ceramic slurry over the carrier film and the one or more via dots;

controlling the thickness of the ceramic layer such that a high surface tension between the ceramic layer and the conductive via dots expels the ceramic slurry in the area of a top surface of the conductive via dot;

allowing the ceramic slurry to dry; and printing a conductive pattern over the dried ceramic slurry and the via dots.

12. The method of claim 1 wherein the multilayer ceramic component is a printed circuit board.

* * * * *

UNITED STATES PATENT AND TRADEMARK OFFICE
CERTIFICATE OF CORRECTION

PATENT NO. : 6,207,234 B1  
DATED : March 27, 2001  
INVENTOR(S) : Jiang, John J.

It is certified that error appears in the above-identified patent and that said Letters Patent is hereby corrected as shown below:

Column 9,
Line 15, the numeral "7" should be deleted and the numeral -- 6 -- should be inserted.

Signed and Sealed this

Eighteenth Day of December, 2001

*Attest:*

JAMES E. ROGAN
*Attesting Officer*    *Director of the United States Patent and Trademark Office*